(12) United States Patent
Bando et al.

(10) Patent No.: US 9,137,892 B2
(45) Date of Patent: Sep. 15, 2015

(54) LAMINATED STRUCTURE, METHOD OF MANUFACTURING LAMINATED STRUCTURE, AND ELECTRONIC APPARATUS

(71) Applicant: Sony Corporation, Tokyo (JP)

(72) Inventors: Masashi Bando, Kanagawa (JP); Keisuke Shimizu, Kanagawa (JP); Koji Kadono, Kanagawa (JP); Nozomi Kimura, Kanagawa (JP); Toshiyuki Kobayashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 5 days.

(21) Appl. No.: 14/082,767

(22) Filed: Nov. 18, 2013

(65) Prior Publication Data

US 2014/0146490 A1    May 29, 2014

(30) Foreign Application Priority Data

Nov. 26, 2012 (JP) .................. 2012-257095

(51) Int. Cl.
| | |
|---|---|
| H05K 1/09 | (2006.01) |
| H05K 1/00 | (2006.01) |
| H05K 1/02 | (2006.01) |
| G06F 3/044 | (2006.01) |
| H05K 3/46 | (2006.01) |

(52) U.S. Cl.
CPC .............. *H05K 1/0289* (2013.01); *G06F 3/044* (2013.01); *G06F 2203/04103* (2013.01); *H05K 1/09* (2013.01); *H05K 3/46* (2013.01); *H05K 3/4635* (2013.01); *H05K 2201/0108* (2013.01); *H05K 2201/0323* (2013.01); *Y10S 977/753* (2013.01); *Y10T 156/10* (2015.01); *Y10T 428/24355* (2015.01); *Y10T 428/30* (2015.01)

(58) Field of Classification Search
CPC ..... H05K 3/4635; H05K 3/46; Y10S 977/753
USPC ............ 361/748; 977/734; 174/257, 258, 259
See application file for complete search history.

(56) References Cited

U.S. PATENT DOCUMENTS

| 8,076,583 | B2 * | 12/2011 | Shimizu ................. 174/126.4 |
| 8,358,008 | B2 * | 1/2013 | Wada et al. ................ 257/750 |
| 2005/0271574 | A1 * | 12/2005 | Jang et al. .................. 423/448 |
| 2007/0284557 | A1 * | 12/2007 | Gruner et al. ............... 252/500 |
| 2010/0266850 | A1 * | 10/2010 | Shimoohsako et al. ... 428/411.1 |
| 2011/0186789 | A1 * | 8/2011 | Samulski et al. ............ 252/514 |
| 2012/0121840 | A1 * | 5/2012 | Aksay et al. ............... 428/36.9 |
| 2012/0128983 | A1 * | 5/2012 | Yoon et al. ................. 428/408 |
| 2012/0325296 | A1 * | 12/2012 | Woo et al. .................. 136/252 |
| 2013/0032913 | A1 * | 2/2013 | Kimura et al. .............. 257/431 |

(Continued)

FOREIGN PATENT DOCUMENTS

| JP | 2012-009479 | | 1/2012 |
| WO | WO 2011063082 | A2 * | 5/2011 |

(Continued)

*Primary Examiner* — Jeremy C Norris
*Assistant Examiner* — Nathan Milakovich
(74) *Attorney, Agent, or Firm* — K&L Gates LLP

(57) ABSTRACT

A laminated structure includes a first substrate, an adhesive, a graphene, and a second substrate. The adhesive is provided on a principal surface of the first substrate, and the adhesive has a storage elastic modulus of $7.2*10^4$ Pa or more and $6.1*10^5$ Pa or less at 23° C. The graphene is bonded to the adhesive, and the graphene has one or a plurality of layers. The second substrate is bonded to the graphene.

13 Claims, 8 Drawing Sheets

(56) References Cited

U.S. PATENT DOCUMENTS

| | | |
|---|---|---|
| 2013/0040146 A1* | 2/2013 | Kimura et al. ............... 428/408 |
| 2013/0048339 A1* | 2/2013 | Tour et al. ................. 174/126.1 |
| 2013/0101247 A1* | 4/2013 | Cho et al. ........................ 385/1 |
| 2013/0206227 A1* | 8/2013 | Shimizu et al. ............. 136/256 |
| 2013/0256629 A1* | 10/2013 | Lee et al. ....................... 257/13 |
| 2013/0264009 A1* | 10/2013 | Kimura et al. .............. 156/230 |
| 2013/0302588 A1* | 11/2013 | Aksay et al. ................. 428/221 |
| 2013/0329366 A1* | 12/2013 | Wang et al. .................. 361/704 |
| 2014/0017444 A1* | 1/2014 | Shimizu et al. ............. 428/131 |
| 2014/0065426 A1* | 3/2014 | Ishihara et al. ............. 428/408 |
| 2014/0251662 A1* | 9/2014 | Rotto et al. .................. 174/253 |

FOREIGN PATENT DOCUMENTS

| | | |
|---|---|---|
| WO | WO 2011112589 A1 * | 9/2011 |
| WO | WO 2012056632 A1 * | 5/2012 |
| WO | WO 2012153674 A1 * | 11/2012 |
| WO | WO 2013168297 A1 * | 11/2013 |
| WO | WO 2013186858 A1 * | 12/2013 |

* cited by examiner

LAMINATED STRUCTURE, METHOD OF MANUFACTURING LAMINATED STRUCTURE, AND ELECTRONIC APPARATUS

CROSS REFERENCES TO RELATED APPLICATIONS

The present application claims priority to Japanese Priority Patent Application JP 2012-257095 filed in the Japan Patent Office on Nov. 26, 2012, the entire content of which is hereby incorporated by reference.

BACKGROUND

The present disclosure relates to a laminated structure, a method of manufacturing a laminated structure, and an electronic apparatus, and is appropriate to be applied to a transparent conductive film used for a display, a touch panel, or the like and various electronic apparatuses that use a transparent conductive film, for example.

In related art, for a transparent conductive film, an ITO transparent conductive film in which an indium-tin composite oxide (ITO) film is deposited on a transparent substrate such as a glass substrate and a transparent plastic film by a vapor deposition method, a sputtering method, or the like is mainly used in terms of its electric conductivity and transparency. However, forming a transparent conductive film by using the above-mentioned methods has a problem of a low throughput because of its necessity of deposition in vacuum. In addition, a problem also lies in the fact that heating of the support substrate at a time of the deposition and patterning after the deposition adversely affect characteristics of devices and the like under a transparent conductive film such as a support substrate.

To avoid the problems described above, a method of printing or applying a dispersion liquid containing conductive substances such as metal microparticles can be conceived, for example. However, in order to achieve high conductivity and optical transparency at the same time, it is necessary to perform not only physical property control of the conductive substances but also a surface treatment for a substrate or lamination of an underlayer to make a film thickness uniform, resulting in complication of the process. For example, Japanese Patent Application Laid-open No. 2012-9479 discloses that a fine line pattern made of silver or copper microparticles is formed on a transparent substrate by printing, and conductive polymers are applied thereon, thereby forming a transparent conductive film.

SUMMARY

However, in the method of forming the transparent conductive film disclosed in Japanese Patent Application Laid-open No. 2012-9479, a surface treatment using a silane coupling agent has to be performed in order to obtain desirable bonding on an interface between the conductive layer and the substrate. This is not a simple process. Further, it is necessary to perform firing at 110° C. in order to improve the conductivity of the metal fine line. There is a fear in that a support substrate may be damaged, or a problem may lie in a heat resistance at a time when the transparent conductive film is formed on an electronic device.

In view of the problems described above, it is desirable to provide a laminated structure including a graphene, which is excellent in graphene adhesion and electric contact performance and is appropriate to be used as a transparent conductive film by a simple method of bonding, and a laminated structure manufacturing method that can easily obtain the laminated structure.

It is also desirable to provide a high-performance electronic apparatus that uses, as a transparent conductive film or the like, the laminated structure including the graphene, which is excellent in graphene adhesion and electric contact performance and is appropriate to be used as the transparent conductive film.

According to an embodiment of the present disclosure, there is provided a laminated structure including a first substrate, an adhesive, a graphene, and a second substrate. The adhesive is provided on a principal surface of the first substrate, and the adhesive has a storage elastic modulus of $7.2*10^4$ Pa or more and $6.1*10^5$ Pa or less at 23° C. The graphene is bonded to the adhesive, and the graphene has one or a plurality of layers. The second substrate is bonded to the graphene.

It is desirable that the first substrate and the adhesive have an adhesion force of 1 N/25 mm or more and 30 N/25 mm or less with respect to a glass plate in a peel test at 90° C. in a viewpoint of ensuring a sufficient adhesion strength of the graphene with respect to the second substrate. It is desirable that the second substrate is provided with an unevenness on a principal surface thereof on the graphene side. The graphene is extremely thin and has plasticity. Therefore, by providing the unevenness on the principal surface of the second substrate on the graphene side, when the graphene is bonded to the second substrate, the graphene is bent along the shape of the unevenness and brought into contact with the side surface of the unevenness. Thus, as compared to the case where the principal surface of the second substrate on the graphene side is flat, a contact surface of the graphene to the second substrate becomes larger by an area where the graphene is in contact with the side surface of the unevenness. As a result, it is possible to increase the adhesion of the graphene to the second substrate. Typically, the second substrate is formed of one of a conductive substrate and a non-conductive substrate and at least one of a wiring and an electrode provided on the substrate, and the unevenness is formed by the at least one of the wiring and the electrode. In this case, at least a part of the graphene is bent to be in contact with at least an upper surface and a side surface of the at least one of the wiring and the electrode. Typically, the at least one of the wiring and the electrode is made of metal.

The graphene may be a continuous layer that is expanded on an entire surface of the adhesive or may be a graphene for which patterning is performed, that is, a plurality of graphenes having island-like shapes.

A use purpose of the laminated structure is not particularly limited. Desirably, the laminated structure can be used as a transparent conductive film or a transparent conductive sheet. In the case where the laminated structure is used as the transparent conductive film, the first substrate, the second substrate, and the adhesive are caused to have transparency with respect to visible light. The transparent conductive film can be used for various electronic apparatuses.

According to another embodiment of the present disclosure, there is provided a method of manufacturing a laminated structure including bonding a graphene having one or a plurality of layers to an adhesive provided on a principal surface of a first substrate, and bonding the graphene to a second substrate. The adhesive has a storage elastic modulus of $7.2*10^4$ Pa or more and $6.1*10^5$ Pa or less at 23° C.

Here, typically, the graphene is formed on a third substrate. In this case, typically, the method of manufacturing a laminated structure further includes bonding the graphene to the second substrate and removing the third substrate. The above description relating to the laminated structure holds true for the other points relating to the method without departing the quality thereof.

According to another embodiment of the present disclosure, there is provided an electronic apparatus including a laminated structure. The laminated structure includes a first substrate, an adhesive, a graphene, and a second substrate. The adhesive is provided on a principal surface of the first substrate, and the adhesive has a storage elastic modulus of $7.2*10^4$ Pa or more and $6.1*10^5$ Pa or less at 23° C. The graphene is bonded to the adhesive, and the graphene has one or a plurality of layers. The second substrate is bonded to the graphene.

Specifically, the electronic is a display such as a liquid crystal display (LCD) and an organic electroluminescence display (organic EL display), a touch panel, or the like. A use purpose of the transparent conductive film is not limited. The description relating to the laminated structure holds true for the other points relating to the electronic apparatus without departing from the quality thereof.

In the present disclosure described above, the adhesive having the storage elastic modulus of $7.2*10^4$ Pa to $6.1*10^5$ Pa (both inclusive) at 23° C. has appropriate adhesion and elasticity. Therefore, the graphene is reliably held by the adhesive. In addition, when the second substrate is bonded to the graphene by pressure application, a force generated because of the elasticity of the adhesive causes the graphene to be sufficiently pressed against the second substrate. Thus, it is possible to reliably adhere the graphene to the surface of the second substrate. At this time, an intermolecular force between the graphene and the second substrate can cause the graphene to be tightly adhered to the surface of the second substrate. Further, in the case where the unevenness such as at least one of the wiring and the electrode is provided on the principal surface of the second substrate, the graphene is bent to be brought into contact with the side surface of the unevenness and the principal surface of the second substrate between the unevenness parts. As a result, a mechanical contact by an anchor effect can also be obtained. Therefore, it is possible to more tightly adhere the graphene to the surface of the second substrate. As a result, for example, in the case where at least one of the wiring and the electrode is provided on the principal surface of the second substrate, it is possible to cause the graphene to be in desirable electrical contact with the at least one of the wiring and the electrode.

According to the present disclosure, it is possible to obtain the laminated structure including the graphene, which is excellent in the electrical contact performance and the adhesion of the graphene and is appropriate to be used as the transparent conductive film by the simple method of bonding. By using the excellent laminated structure as the transparent conductive film or the like, it is possible to attain various electronic apparatuses such as a display and a touch panel with high performance.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

DETAILED DESCRIPTION

Hereinafter, embodiments of the present disclosure will be described. It should be noted that the description will be given in the following order.

1. First embodiment (laminated structure and method of manufacturing the same)

2. Second embodiment (laminated structure and method of manufacturing the same)

1. First Embodiment

Laminated Structure and Method of Manufacturing the Same

FIGS. 1A to 1D and FIGS. 2A to 2D are views showing a laminated structure and a method of manufacturing the same according to a first embodiment.

Figure 1A:
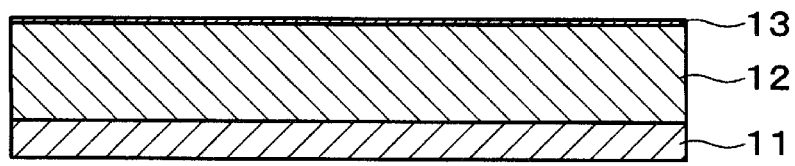
FIGS. 1A to 1D are cross-sectional views for explaining a laminated structure and a method of manufacturing the same according to a first embodiment.

As shown in FIG. 1A, a structure in which a graphene 13 having one or a plurality of layers is adhered on a first substrate 11 by an adhesive 12 is prepared. As the first substrate 11, a desired substrate is used. The substrate may be transparent or non-transparent and may be flexible or inflexible. A material of the transparent substrate is selected as necessary. For example, a transparent inorganic material such as quartz and glass, transparent plastic, or the like can be used as the material. As the flexible transparent substrate, a transparent plastic substrate is used. Examples of the transparent plastic include polyethylene terephthalate, polyethylene naphthalate, polycarbonate, polystyrene, polyethylene, polypropylene, polyphenylene sulfide, polyvinylidene fluoride, acetylcellulose, brominated phenoxy, aramids, polyimides, polystyrenes, polyarylates, polysulfones, polyolefins, and the like. As the non-transparent substrate, a silicon substrate is used, for example. The thickness of the first substrate 11 is selected as appropriate depending on a use purpose of the laminated structure, especially, a transparent conductive film, for example. The first substrate 11 serves as a support body or a protection layer for the graphene 13. The adhesive 12 has a storage elastic modulus of $7.2*10^4$ Pa to $6.1*10^5$ Pa (both inclusive) at 23° C., and typically has a refractive index of 1.51 to 1.75 (both inclusive) and has transparency with respect to visible light. The adhesive 12 may have any composition as long as the storage elastic modulus thereof falls within the range of $7.2*10^4$ Pa to $6.1*10^5$ Pa (both inclusive) at 23° C. The adhesive 12 is selected as necessary and mainly contains acrylic resin-based or epoxy resin-based polymer, for example. As described above, the graphene 13 may have one layer or two or more layers. Each time the number of layers is increased by one, a visible light transmittance is decreased by 2.3%. Therefore, the number of layers of the graphene 13 is determined as appropriate in accordance with the transmittance necessary for the laminated structure, especially, the transparent conductive film.

Figure 1B:
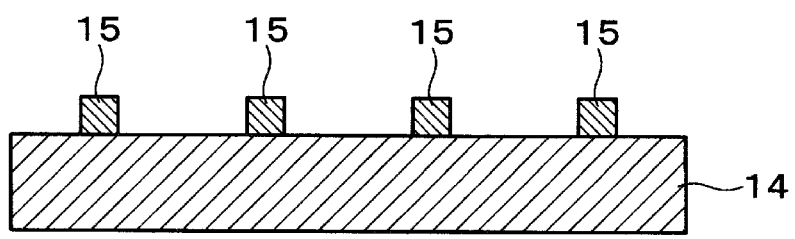

On the other hand, as shown in FIG. 1B, on a second substrate 14, one or more metal electrodes are formed. As the second substrate 14, a substrate similar to the first substrate 11 can be used. A metal electrode 15 is a pure metal or an alloy constituted of at least one kind of metal selected from a group consisting of copper (Cu), silver (Ag), aluminum (Al), gold (Au), iron (Fe), nickel (Ni), titanium (Ti), and platinum (Pt), but another metal may be used therefor. The thickness of the metal electrode 15 is selected as appropriate, for example, 3 µm to 15 µm (both inclusive), typically, 5 µm to 12 µm (both inclusive).

Figure 1C:
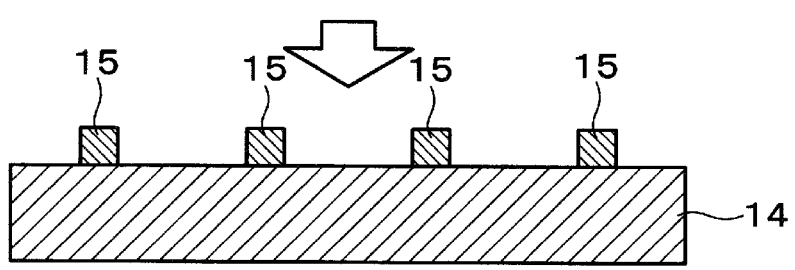
Figure 1D:
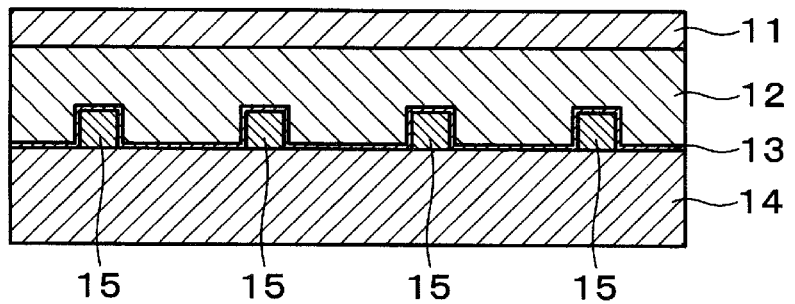

Subsequently, as shown in FIG. 1C, the graphene 13 on the first substrate 11 and the metal electrodes 15 on the second substrate 14 are faced and adhered to each other by applying a pressure. The adhesion can be performed in a room temperature. At a time when the pressure is applied, the storage elastic modulus of the adhesive 12 at 23° C. is $7.2*10^4$ Pa to $6.1*10^5$ Pa (both inclusive). Therefore, at the time of the pressure application, the graphene 13 is subjected to an appropriate pressure. As a result, when pressed against the second substrate 14 on which the metal electrodes 15 are formed, the graphene 13 having an extremely small thickness and plasticity is brought into contact with upper surfaces of the metal electrodes 15, is then bent so as to be in contact with both side surfaces of the metal electrodes 15, and is finally brought into contact with the surface of the second substrate 14 which is exposed between the metal electrodes 15. In this way, the graphene 13 is brought into contact with the upper surface and the both side surfaces of each of the metal electrodes 15, with the result that the graphene 13 and the metal electrodes 15 are electrically connected to each other.

Through the process described above, as shown in FIG. 1D, the first substrate 11 on which the graphene 13 is formed and the second substrate 14 on which the metal electrodes 15 are formed are adhered to each other, thereby obtaining the laminated structure in which the graphene 13 and the metal electrodes 15 are electrically connected with each other.

FIGS. 2A to 2D show a method of manufacturing the first substrate 11 to which the graphene 13 is adhered by the adhesive 12 shown in FIG. 1A.

Figure 2A:
FIGS. 2A to 2D are cross-sectional views for explaining the laminated structure and the method of manufacturing the same according to the first embodiment.

As shown in FIG. 2A, the graphene 13 is formed on a third substrate 16. As the third substrate 16, a substrate is used, on at least a surface of which a metal catalyst made of a pure metal such as copper (Cu), nickel (Ni), platinum (Pt), palladium (Pd), ruthenium (Ru), iridium (Ir), gold (Au), silver (Ag), chromium (Cr), titanium (Ti), manganese (Mn), silicon (Si), gallium (Ga), indium (In), and aluminum (Al) or an alloy or the like constituted of two or more metals selected from those metals is formed. For example, a metal foil formed of the pure metal or alloy is used, but the material is not limited to those. A synthesis method for the graphene 13 is not particularly limited. Desirably, a chemical vapor deposition (CVD) method is used. In order to form the graphene 13 having a single layer, a copper foil is desirably used as the third substrate 16.

Figure 2B:
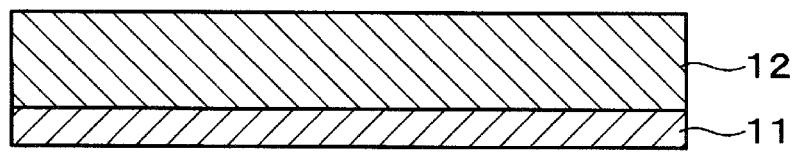

On the other hand, as shown in FIG. 2B, the adhesive 12 is applied on the first substrate 11. In order to make the surface of the adhesive 12 flat, the thickness of the adhesive 12 is desirably set to, for example, 30 µm or less, more desirably, 20 µm or less, but is not limited to this. Further, in order to obtain a sufficient adhesion force, the thickness of the adhesive 12 is desirably set to, for example, 1 µm or more, more desirably, 2 µm or more, but is not limited to this.

As a method of applying the adhesive 12, a known method can be used and selected as necessary. Specifically, examples of the applying method include a spin coating method, a dipping method, a cast method, or the like, various printing methods such as a screen printing method, an inkjet printing method, an offset printing method, and a gravure printing method, various coating methods such as a stamp method, a spray method, an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slot orifice coater method, and a calendar coater method, and the like.

Figure 2C:
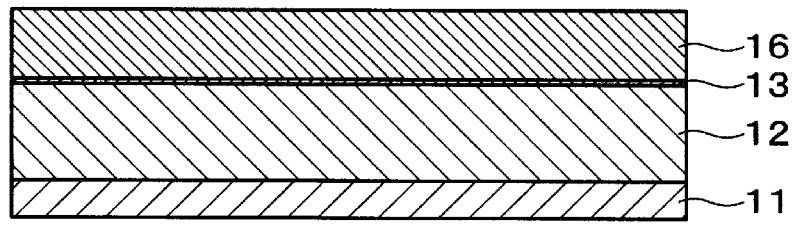

Next, as shown in FIG. 2C, the third substrate 16 and the graphene 13 are placed on the adhesive 12 of the second substrate 14 with the graphene 13 faced downward, and the graphene 13 is adhered to the adhesive 12.

Figure 2D:
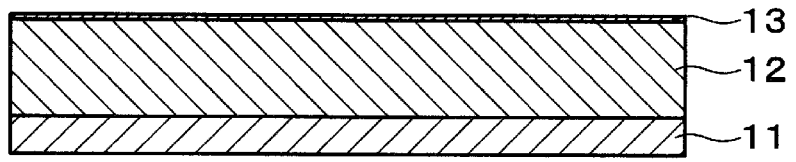

Then, as shown in FIG. 2D, the third substrate 16 is removed. To remove the third substrate 16, etching is desirably used. The etching method is not particularly limited as long as the metal catalyst that forms the third substrate 16 can be removed. As the etching method, dry etching that uses a vacuum apparatus or wet etching that uses an etchant (etching liquid) may be used. In a viewpoint of etching efficiency, the wet etching is desirable. The wet etching can be performed by spraying the etchant to the third substrate 16 or by immersing the third substrate 16 in the etchant in an etching tank. The etchant used in the wet etching is not particularly limited as long as the etchant can dissolve the metal catalyst. In the case where the metal catalyst is made of copper, for example, when the third substrate 16 is made of copper, a mixture in which a hydrochloric acid is mixed in ferric chloride or copper chloride can be desirably used as the etchant. An oxidation-reduction etchant such as ferric nitrate and ferric chloride or an acid such as a phosphoric acid and a nitric acid can also be used. In the case where the oxidation-reduction etchant is used, bubbles are not generated at the time of etching. Therefore, it is possible to suppress an occurrence of a defect in the graphene 13 and uniformly dissolve the metal catalyst. In the case where the wet etching is performed by immersing the third substrate 16 into the etchant in the etching tank, to increase an etching speed, the etchant is desirably stirred at the time of etching. In the etching, electrolytic etching in a copper sulfate solution may be used.

After that, the surface of the graphene 13 exposed by removing the third substrate 16 is washed by pure water or the like and dried.

As described above, the first substrate 11 to which the graphene 13 is adhered by the adhesive 12 is manufactured.

When necessary, after the graphene 13 is synthesized on the third substrate 16, the graphene 13 may be partially fluorinated. Specifically, a resist pattern having a predetermined shape is formed on the graphene 13 by lithography, for example. Subsequently, a part of the graphene 13 which is not covered with the resist pattern is exposed to a gas containing fluorine, such as xenon difluoride, thereby fluorinating the part. As a result, the part of the graphene 13 which is fluorinated becomes an insulating body. Thus, anisotropy is given to in-plane electric conduction of the graphene 13, and a higher light transmittance can be obtained.

As described above, according to the first embodiment, the graphene 13 adhered to the adhesive 12 having the storage elastic modulus of $7.2*10^4$ Pa to $6.1*10^5$ Pa (both inclusive) at 23° C. and disposed on the first substrate 11 is adhered to the second substrate 14 on which the metal electrodes 15 are formed. In this case, in addition to an adhesion effect by an intermolecular force between the graphene 13 and the metal electrode 15 and second substrate 14, it is also possible to obtain a mechanical adhesion effect by an anchor effect generated because the graphene 13 is bent to be in contact with the upper surfaces and the both side surfaces of the metal electrodes 15 and the surface of the second substrate 14 exposed between the metal electrodes 15. Therefore, it is possible to adhere the graphene 13 to the metal electrodes 15 and the second substrate 14. Further, only by adhering the graphene 13 adhered to the adhesive 12 disposed on the first substrate 11 to the second substrate 14 on which the metal electrodes 15 are formed, it is possible to obtain the laminated structure including the graphene. As a result, it is possible to significantly reduce a takt time of the laminated structure and significantly reduce a manufacturing cost as compared to a past method of forming a transparent conductive film in which a high temperature and a vacuum condition are necessary. In addition, the adhesion can be performed in a room temperature, so the second substrate 14 on which the metal electrodes 15 are formed does not have to have heat resistance, and therefore a large degree of freedom of selecting the second substrate 14 can be obtained. Further, at the time of the adhesion, the metal electrodes 15 are covered with the graphene 13, so it is possible to prevent the adhesive 12 from being in direct contact with the metal electrodes 15. Thus, it is possible to prevent the metal electrodes 15 from corroding away due to the adhesive 12. In particular, by using a material having transparency with respect to visible light for the first substrate 11, the second substrate 14, and the adhesive 12, it is possible to obtain the transparent conductive film by the laminated structure. It is appropriate to use the excellent transparent conductive film for a display, a touch panel, or the like.

2. Second Embodiment

Laminated Structure and Method of Manufacturing the Same

Figure 3A:
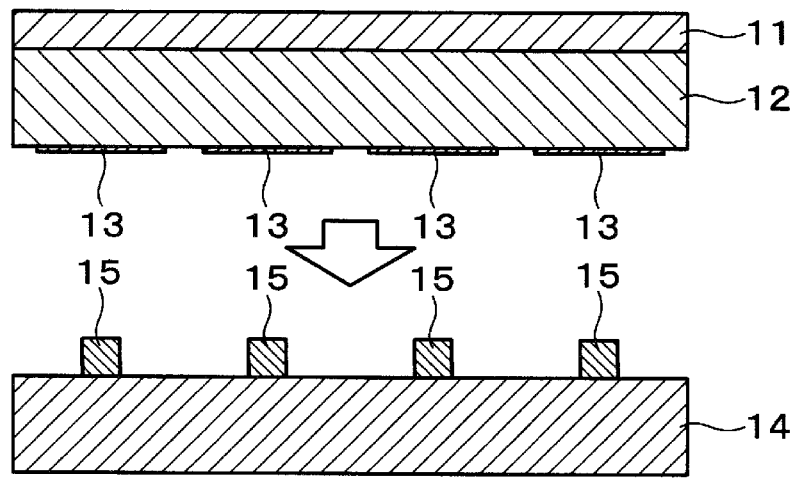
FIGS. 3A and 3B are cross-sectional views for explaining a laminated structure and a method of manufacturing the same according to a second embodiment.
Figure 3B:
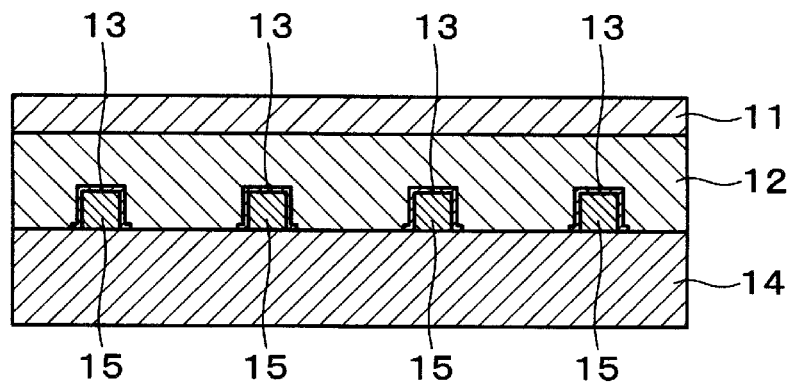

FIGS. 3A and 3B are views showing a laminated structure and a method of manufacturing the same according to a second embodiment.

As shown in FIG. 3A, the second embodiment is the same as the first embodiment in that the structure is formed in which the graphene 13 having one or more layers is adhered on the first substrate 11 with the adhesive 12. In this case, the graphene 13 is subjected to patterning into a plurality of portions in advance, and the graphenes 13 each have an island-like planar shape. The graphenes 13 are formed so as to correspond to the metal electrodes 15 formed on the second substrate 14. The patterning of the graphene 13 can be performed as follows, for example. That is, in the same way as the first embodiment, first, the graphene 13 is synthesized on the third substrate 16. Then, a resist pattern having a predetermined shape is formed on the graphene 13 by lithography, and an oxygen plasma treatment, an air plasma treatment, or the like is performed with the resist pattern as a mask. As a result, a part of the graphene 13 which is not covered with the resist pattern is removed. After that, the resist pattern is removed. Thus, it is possible to perform the patterning of the graphene 13.

Then, as shown in FIGS. 3A and 3B, the graphenes 13 on the first substrate 11 and the metal electrodes 15 on the second substrate 14 are faced and adhered to each other by applying a pressure. At the time of the pressure application, as in the first embodiment, the storage elastic modulus of the adhesive 12 is $7.2*10^4$ Pa to $6.1*10^5$ Pa (both inclusive) at 23° C., and the graphene 13 is subjected to an appropriate pressure. Therefore, when pressed against the second substrate 14 on which the metal electrodes 15 are formed, the graphene 13 having the extremely small thickness and plasticity is brought into contact with the upper surfaces of the metal electrodes 15, is then bent so as to be in contact with both side surfaces of the metal electrodes 15, and is finally brought into contact with the surface of the second substrate 14 which is exposed between the metal electrodes 15. In this way, the graphenes 13 are in contact with the upper surfaces and the both side surfaces of the metal electrodes 15, with the result that the graphenes 13 and the metal electrodes 15 are electrically connected to each other. In this case, the adhesive 12 is in direct contact with the surface of the second substrate exposed between the metal electrodes 15, so the adhesion of the graphenes 13 with respect to the metal electrodes 15 and the second substrate 14 is further improved.

Through the process described above, the first substrate 11 on which the patterned graphenes 13 are formed is adhered to the second substrate 14 on which the metal electrodes 15 are formed, thereby obtaining the laminated structure in which the graphenes 13 and the metal electrodes 15 are electrically connected to each other.

According to the second embodiment, in addition to the advantages as in the first embodiment, it is also possible to obtain such an advantage that the second substrate 14 can be prevented from being damaged, because it is unnecessary to perform the patterning for the graphene 13 after the laminated structure is formed.

Example 1

Example Corresponding to First Embodiment

As the third substrate 16, a copper foil having a thickness of 35 μm was used.

The copper foil was put in an evacuated quartz tube furnace of a CVD apparatus, and heating was performed at 1000° C. for 10 minutes at a hydrogen partial pressure of 0.5 Torr, thereby removing a natural oxide film on a surface of the copper foil.

Subsequently, in the quartz tube furnace, in a mixed gas atmosphere of methane and hydrogen having a total pressure of 1 Torr and a flow rate ratio of 1:1, heating at 1000° C. was performed for 10 minutes, thereby synthesizing the graphene 13 having a single layer on the surface of the copper foil. After the synthesis, the temperature was decreased while causing a hydrogen gas to flow again. After that, the copper foil on which the graphene 13 was synthesized was taken out of the quartz tube furnace. The graphene 13 thus synthesized had a light transmittance of 97.5% and a surface resistance of 250Ω.

As the first substrate 11 and the adhesive 12, a commercially available, highly transparent adhesive transfer tape which had an adhesion force of 1 N/25 mm to 30 N/25 mm (both inclusive) with respect to a glass plate in a peel test at 90° C. was used. The adhesive 12 that forms an adhesive of the highly transparent adhesive transfer tape is an adhesive composition, the main component of which is a (meta)acrylic polymer having a cyclic ether group.

To the highly transparent adhesive transfer tape, a copper foil with a single-layer graphene was adhered by applying a pressure at a room temperature.

Then, the highly transparent adhesive transfer tape to which the copper foil with the single-layer graphene was adhered was entirely immersed in a ferric nitrate ($Fe(NO_3)_3$) solution of 1 M for 50 minutes, and the copper foil was removed by etching.

After that, the highly transparent adhesive transfer tape and the graphene 13 were washed with ultrapure water and dried. A surface resistance of a transparent conductive film thus obtained was 300Ω.

Figure 4A:
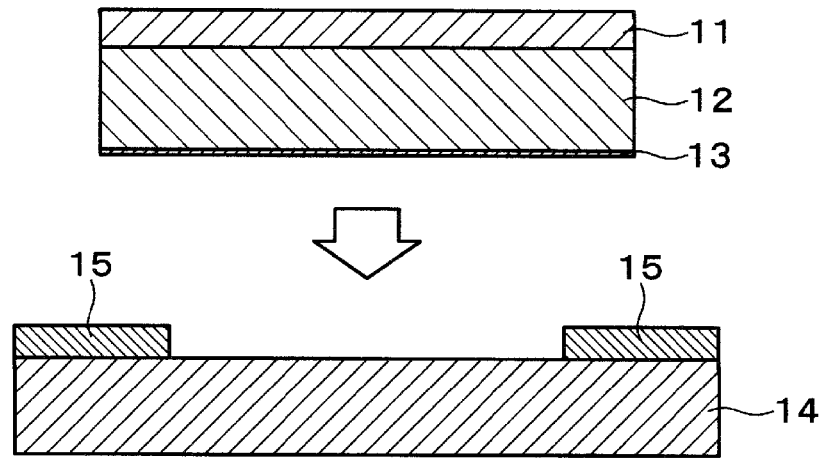
FIGS. 4A and 4B are cross-sectional views for explaining an example 1.
Figure 4B:
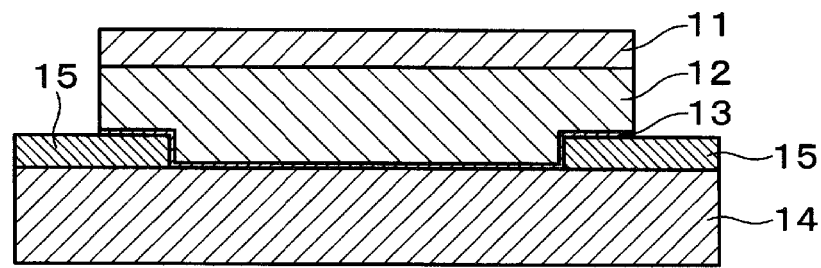
Figure 5:
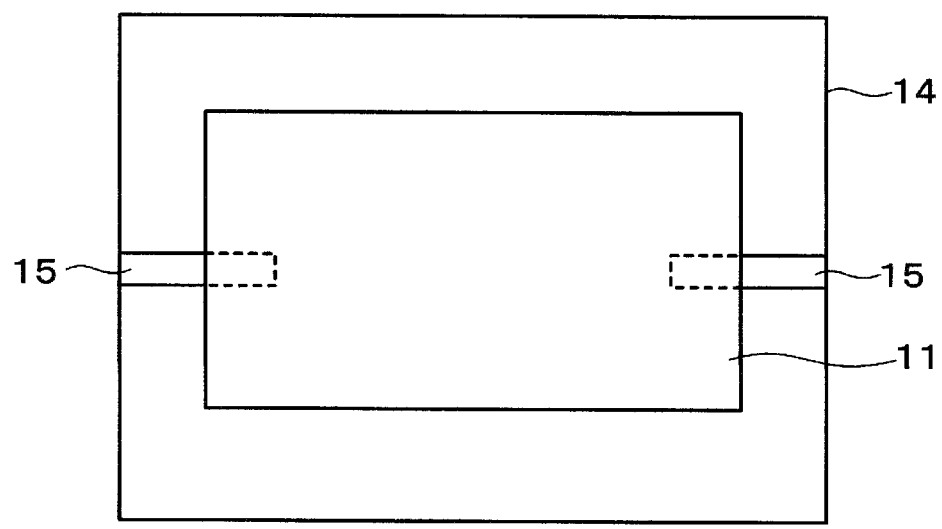
FIG. 5 is a plan view for explaining the example 1.

As shown in FIGS. 4A and 4B, as the second substrate 14 on which the metal electrodes 15 were formed, a PET substrate was used on which a pair of metal electrodes 15 made of silver was formed by printing. A laminated body of the highly transparent adhesive transfer tape and the graphene was adhered to the PET substrate, on which the metal electrodes 15 made of silver were formed by printing, at a room temperature by applying a pressure with the graphene 13 side facing the PET substrate side. FIG. 5 is a view showing a plan view (top view) of a laminated structure obtained by the adhesion.

As described above, the laminated body constituted of the highly transparent adhesive transfer tape, the graphene, and the PET substrate was formed. In the laminated structure, it was confirmed that the metal electrodes 15 made of silver were electrically conducted, that is, the graphene 13 and the metal electrodes 15 made of silver were in electrical contact with each other.

Example 2

Example Corresponding to Second Embodiment

As the third substrate 16, a copper foil having a thickness of 35 μm was used.

The copper foil was put in an evacuated quartz tube furnace of a CVD apparatus, and heating was performed at 1000° C. for 10 minutes at a hydrogen partial pressure of 0.5 Torr, thereby removing a natural oxide film on a surface of the copper foil.

Subsequently, in the quartz tube furnace, in a mixed gas atmosphere of methane and hydrogen having a total pressure of 1 Torr and a flow rate ratio of 1:1, heating at 1000° C. was performed for 10 minutes, thereby synthesizing the graphene 13 having a single layer on the surface of the copper foil. After the synthesis, the temperature was decreased while causing a hydrogen gas to flow again. After that, the copper foil on which the graphene 13 was synthesized was taken out of the quartz tube furnace. The graphene 13 thus synthesized had a light transmittance of 97.5% and a surface resistance of 250Ω.

Then, on the graphene 13 on the copper foil, a resist pattern having a predetermined shape was formed. After that, an oxygen plasma treatment was performed with the resist pattern used as a mask, thereby removing a part of the graphene 13 which is not covered with the resist pattern. After that, the resist pattern was removed. In this way, a graphene pattern was formed in which the graphenes 13 patterned into rhombus shapes were connected vertically in a beaded form with a point thereof shared with the next rhombus shape, and the connected rhombus shapes were arranged in parallel to each other.

As the first substrate 11 and the adhesive 12, a commercially available, highly transparent adhesive transfer tape which had an adhesion force of 1 N/25 mm to 30 N/25 mm (both inclusive) with respect to a glass plate in a peel test at 90° C. was used. The adhesive 12 that forms an adhesive of the highly transparent adhesive transfer tape is an adhesive composition, the main component of which is a (meta)acrylic polymer having a cyclic ether group.

To the highly transparent adhesive transfer tape, a copper foil with the single-layer graphene which has been subjected to the patterning was adhered by applying a pressure at a room temperature.

Then, the highly transparent adhesive transfer tape to which the copper foil with the single-layer graphene patterned was adhered was entirely immersed in a ferric nitrate ($Fe(NO_3)_3$) solution of 1 M for 50 minutes, and the copper foil was removed by etching.

Figure 6:
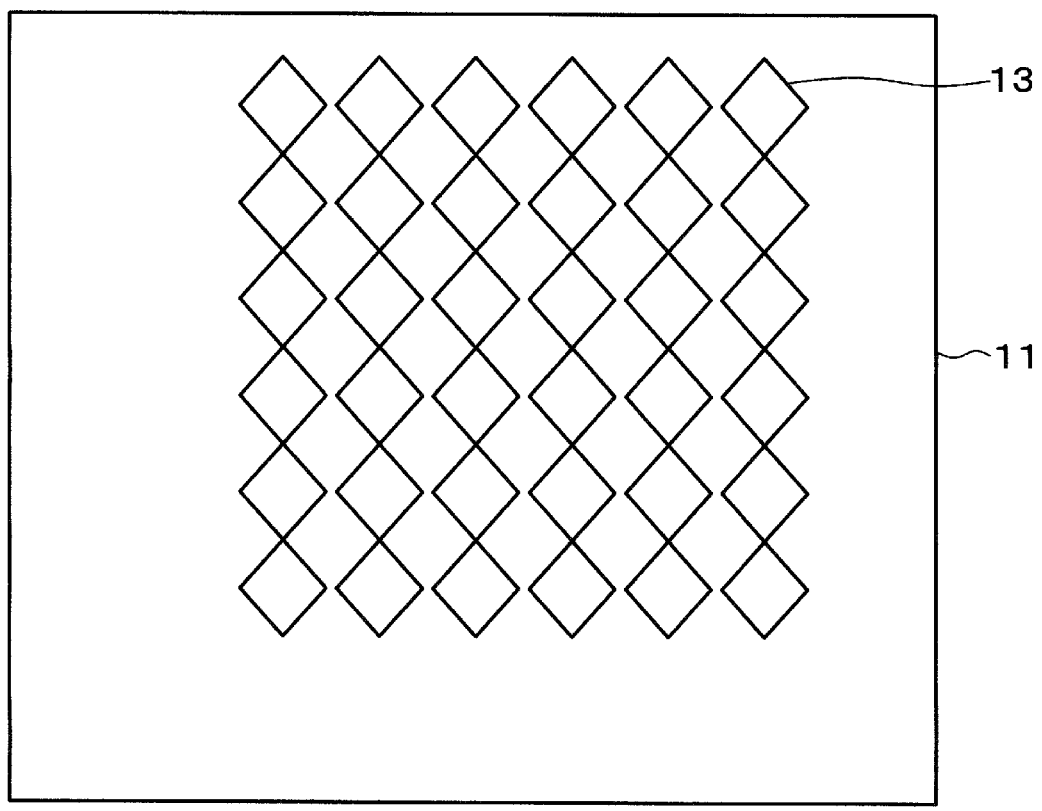
FIG. 6 is a plan view for explaining an example 2.

After that, the highly transparent adhesive transfer tape and the graphene were washed with ultrapure water and dried. A surface resistance of a transparent conductive film thus obtained was 300Ω. FIG. 6 is a view showing the graphene 13 patterned on the highly transparent adhesive transfer tape as the first substrate 11 and the adhesive 12.

Figure 7:
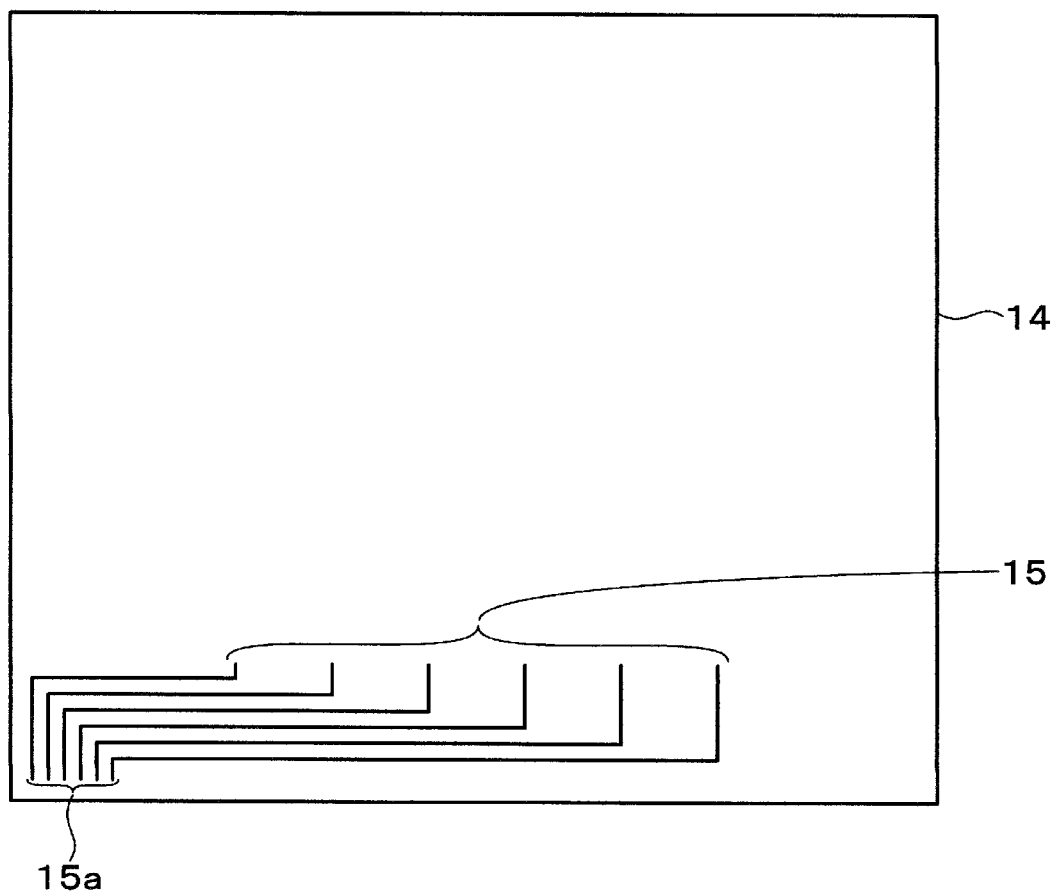
FIG. 7 is a plan view for explaining the example 2.
Figure 8:
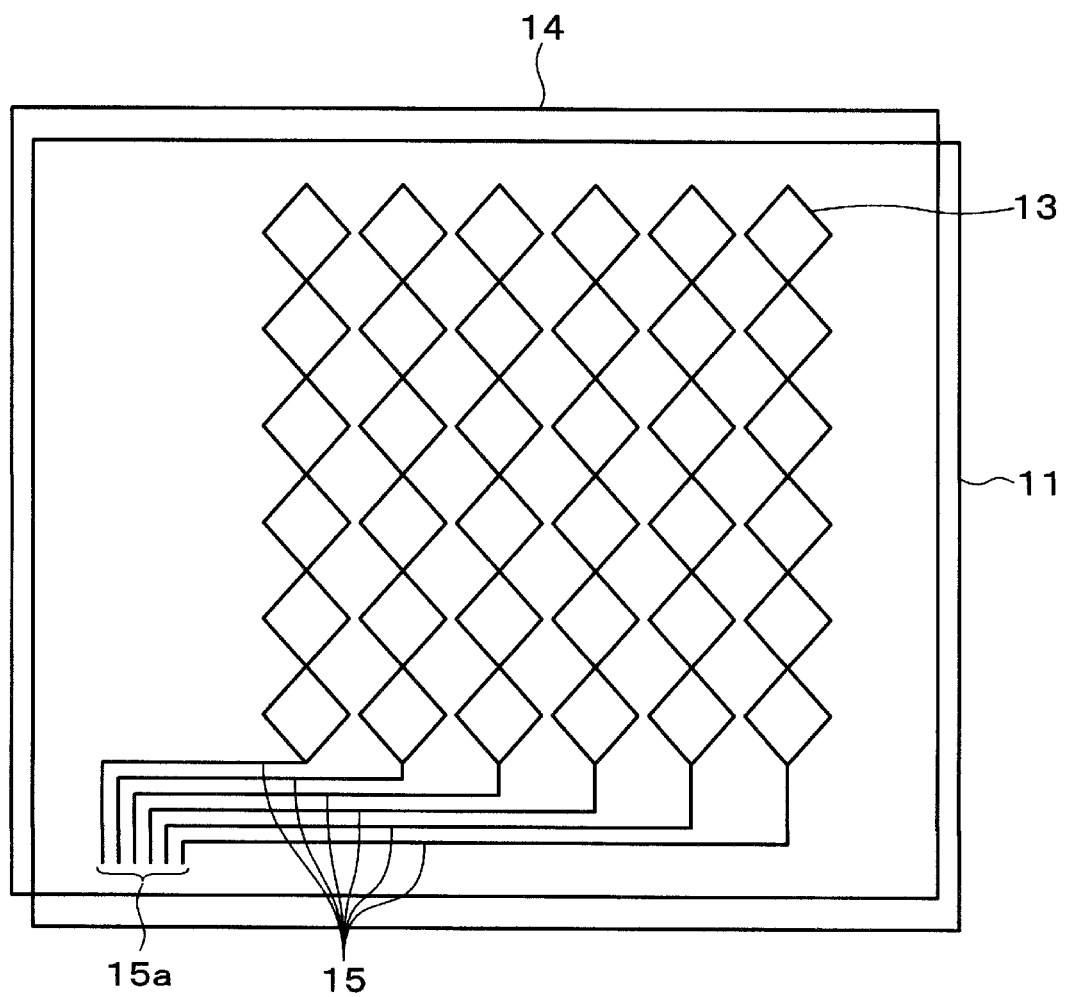
FIG. 8 is a plan view for explaining the example 2.

Subsequently, as shown in FIG. 7, as the second substrate 14 on which the metal electrodes 15 were formed, a PET substrate was used on which the metal electrodes 15 made of silver and including draw-out electrodes 15a were formed by printing. Then, as shown in FIG. 8, a laminated body of the highly transparent adhesive transfer tape and the graphene was adhered to the PET substrate, on which the draw-out electrodes 15a made of silver were formed by printing, at a room temperature by applying a pressure with the graphene 13 side facing the PET substrate side.

As described above, the laminated body constituted of the highly transparent adhesive transfer tape, the graphene, and the PET substrate was formed.

The laminated structure is appropriate to be used for a transparent conductive film of a capacitive touch panel, for example. With the laminated structure, it is possible to easily obtain the transparent conductive film of the capacitive touch panel only by adhering the graphene 13 side of the laminated body of the highly transparent adhesive transfer tape and the graphene to the PET substrate on which the draw-out electrodes 15a made of silver are formed by printing.

The embodiments and examples are described above in detail. The present disclosure is not limited to the above embodiments and examples and can be variously modified.

For example, the numerical values, configurations, processes, shapes, materials, and the like that are cited in the embodiments and examples are merely examples, and different numerical values, configurations, processes, shapes, materials, and the like may be used when necessary.

It should be noted that the present disclosure can take the following configurations.

(1) A laminated structure, including:
a first substrate;
an adhesive provided on a principal surface of the first substrate, the adhesive having a storage elastic modulus of $7.2*10^4$ Pa or more and $6.1*10^5$ Pa or less at 23° C.;
a graphene bonded to the adhesive, the graphene having one or a plurality of layers; and
a second substrate bonded to the graphene.

(2) The laminated structure according to Item (1), in which
the first substrate and the adhesive have an adhesion force of 1 N/25 mm or more and 30 N/25 mm or less with respect to a glass plate in a peel test at 90° C.

(3) The laminated structure according to Item (1) or (2), in which
the second substrate is provided with an unevenness on a principal surface thereof on the graphene side.

(4) The laminated structure according to any one of Items (1) to (3), in which
the second substrate is formed of one of a conductive substrate and a non-conductive substrate and at least one of a wiring and an electrode provided on the substrate, and the unevenness is formed by the at least one of the wiring and the electrode.

(5) The laminated structure according to Item (4), in which
at least a part of the graphene is bent to be in contact with at least an upper surface and a side surface of the at least one of the wiring and the electrode.

(6) The laminated structure according to any one of Items (1) to (5), in which
the graphene is a graphene for which patterning is performed.

(7) The laminated structure according to any one of Items (1) to (6), in which
the at least one of the wiring and the electrode is made of metal.

(8) The laminated structure according to any one of Items (1) to (7), in which
the adhesive has transparency with respect to visible light.

(9) The laminated structure according to any one of Items (1) to (8), in which
the first substrate and the second substrate have transparency with respect to visible light.

(10) The laminated structure according to any one of Items (1) to (9),
the laminated structure being a transparent conductive film.

(11) A method of manufacturing a laminated structure, including:
bonding a graphene having one or a plurality of layers to an adhesive provided on a principal surface of a first substrate, the adhesive having a storage elastic modulus of $7.2*10^4$ Pa or more and $6.1*10^5$ Pa or less at 23° C.; and
bonding the graphene to a second substrate.

(12) The method of manufacturing a laminated structure according to Item (11), in which
the graphene is formed on a third substrate.

(13) The method of manufacturing a laminated structure according to Item (11) or (12), further including
bonding the graphene to the second substrate and removing the third substrate.

(14) The method of manufacturing a laminated structure according to any one of Items (11) to (13), in which
the laminated structure is a transparent conductive film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A laminated structure comprising:
a first substrate;
an adhesive provided on a principal surface of the first substrate, the adhesive having a storage elastic modulus of $7.2*10^4$ Pa or more and $6.1*10^5$ Pa or less at 23° C.;
a graphene bonded to the adhesive, the graphene having one or a plurality of layers;
a second substrate bonded to the graphene; and
at least one of a wiring and an electrode provided on the second substrate, wherein, when the laminated structure is obtained, at least a part of the graphene is bent to be in contact with at least an upper surface and a side surface of the at least one of the wiring and the electrode.

2. The laminated structure according to claim 1, wherein the first substrate and the adhesive have an adhesion force of 1 N/25 mm or more and 30 N/25 mm or less with respect to a glass plate in a peel test at 90° C.

3. The laminated structure according to claim 2, wherein the second substrate is formed of one of a conductive substrate and a non-conductive substrate.

4. The laminated structure according to claim 1, wherein the graphene is a graphene for which patterning is performed.

5. The laminated structure according to claim 4, wherein the at least one of the wiring and the electrode is made of metal.

6. The laminated structure according to claim 5, wherein the adhesive has transparency with respect to visible light.

7. The laminated structure according to claim 6, wherein the first substrate and the second substrate have transparency with respect to visible light.

8. The laminated structure according to claim 7, the laminated structure being a transparent conductive film.

9. A method of manufacturing a laminated structure, comprising:
bonding a graphene having one or a plurality of layers to an adhesive provided on a principal surface of a first substrate, the adhesive having a storage elastic modulus of $7.2*10^4$ Pa or more and $6.1*10^5$ Pa or less at 23° C.;
bonding the graphene to a second substrate;
providing at least one of a wiring and an electrode on the second substrate; and
bending at least a part of the graphene to be in contact with at least an upper surface and a side surface of the at least one of the wiring and the electrode, thereby obtaining the laminated structure.

10. The method of manufacturing a laminated structure according to claim 9, wherein the graphene is formed on a third substrate before bonding to the second substrate, and the third substrate is removed after bonding the graphene to the second substrate.

11. The method of manufacturing a laminated structure according to claim 10, wherein the laminated structure is a transparent conductive film.

12. An electronic apparatus comprising:
a laminated structure including
a first substrate,
an adhesive provided on a principal surface of the first substrate, the adhesive having a storage elastic modulus of $7.2*10^4$ Pa or more and $6.1*10^5$ Pa or less at 23° C.,
a graphene bonded to the adhesive, the graphene having one or a plurality of layers,
a second substrate bonded to the graphene, and
at least one of a wiring and an electrode provided on the second substrate, wherein, when the laminated structure is obtained, at least a part of the graphene is bent to be in contact with at least an upper surface and a side surface of the at least one of the wiring and the electrode.

13. The electronic apparatus according to claim 12, the electronic apparatus being one of a display and a touch panel.

* * * * *